United States Patent
Low et al.

(10) Patent No.: US 6,573,113 B1
(45) Date of Patent: Jun. 3, 2003

(54) INTEGRATED CIRCUIT HAVING DEDICATED PROBE PADS FOR USE IN TESTING DENSELY PATTERNED BONDING PADS

(75) Inventors: Qwai H. Low, Cupertino, CA (US); William T. Bright, II, Ft. Collins, CO (US); Ramaswamy Ranganathan, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/946,033

(22) Filed: Sep. 4, 2001

(51) Int. Cl.[7] ............................................. H01L 21/66
(52) U.S. Cl. .......................................... 438/18; 438/14
(58) Field of Search ............................... 438/18, 17, 16, 438/14, 15, 460, 462; 257/48

(56) References Cited

U.S. PATENT DOCUMENTS

| | | | | |
|---|---|---|---|---|
| 5,870,289 A | * | 2/1999 | Tokuda et al. ............... 361/779 |
| 5,896,039 A | * | 4/1999 | Brannigan et al. ........... 324/763 |
| 5,896,040 A | * | 4/1999 | Brannigan et al. ........... 324/763 |
| 6,063,640 A | * | 5/2000 | Mizukoshi et al. ............ 438/15 |
| 6,159,826 A | * | 12/2000 | Kim et al. .................... 438/460 |
| 6,320,201 B1 | * | 11/2001 | Corbett et al. ................. 257/48 |
| 6,326,801 B1 | * | 12/2001 | Whetsel ....................... 324/765 |
| 6,424,168 B1 | * | 7/2002 | Farnworth et al. ........... 324/765 |
| 6,445,603 B1 | * | 9/2002 | Abedifard ..................... 365/51 |
| 6,452,415 B1 | * | 9/2002 | Farnworth et al. ........... 324/765 |

* cited by examiner

*Primary Examiner*—John F. Niebling
*Assistant Examiner*—Olivia Luk
(74) *Attorney, Agent, or Firm*—Conley, Rose & Tayon

(57) ABSTRACT

An integrated circuit topography is provided which includes at least two rows of bonding pads. Each row of bonding pads is attributed a row of probe pads. One row of probe pads is contained within the scribe area and suffices as a sacrificial row of probe pads. The other row of probe pads is placed toward the interior of the integrated circuit. The rows of bonding pads and probe pads extend along parallel axis around all four sides of the integrated circuit. Every other bonding pad within one row of bonding pads is connected to every other probe pad within the scribe area, and every other bonding pad within the other rows of bonding pads is connected to every probe pad within the row of probe pads interior to the integrated circuit. This allows a fan-out configuration of the bonding pads to probe pads for purposes of probing electrical performance of the integrated circuit without having to use selected ones of the bonding pads. This prevents jeopardizing the integrity of the bonding pad by gouging out the bonding pad during probe operation. Moreover, thicker probe needles can be used, and placed in a less dense fashion around the outer perimeter of the integrated circuit.

11 Claims, 2 Drawing Sheets

INTEGRATED CIRCUIT HAVING DEDICATED PROBE PADS FOR USE IN TESTING DENSELY PATTERNED BONDING PADS

BACKGROUND OF THE INVENTION

1. Field of the Invention

This invention relates to integrated circuits, and more particularly to probe testing of integrated circuits.

2. Description of the Related Art

The following descriptions and examples are not admitted to be prior art by virtue of their inclusion within this section.

Integrated circuits have evolved over the years. They have become increasingly more complex in functionality, and encompass more features and operate at higher speeds than predecessor circuits. In addition, modern integrated circuits employ smaller critical dimensions and use more and more of interconnect. As the integrated circuit becomes smaller in critical dimension, and more dense in overall circuitry, the number of bonding pads per integrated circuit has also increased.

Typically, the bonding pads of an integrated circuit are arranged on the periphery of that circuit. An integrated circuit can encompass a single dice within a plurality of die which form a wafer. Generally, the bonding pads are arranged near the outer edge of the die. The bonding pads extend along a single line, or axis, adjacent each of the four edges of the dice. The bonding pads can be either wire-bonded to posts upon a package, or they can be surface mounted in a flip-chip application.

The bonding pads are generally made of aluminum or an aluminum alloy. When bonding a gold wire to the bonding pad, the wire is directed to the bonding pad using a capillary and a ball is formed at the end of the capillary. Ultrasonic energy and temperature along with a bond force creates the diffusion of the gold into the aluminum forming an intermettalic. The wire is typically small in diameter compared to the bonding pad. However, as the size of the bonding pad decreases, it is imperative that sufficient aluminum be retained on the bonding pad after the probe test operation. If aluminum is scraped off by the probe needle during probe test, the ensuing wire bond will be jeopardized.

Prior to bonding wires being applied to corresponding bonding pads, each integrated circuit is tested during a probe operation. Typical probe operations involve placing a bed of closely configured probe needles on each and every bonding pad of an integrated circuit and testing that circuit. Thereafter, the bed of probe needles are moved to the neighboring integrated circuit and applied to a new set of bonding pads until each and every integrated circuit upon the wafer is functionally tested. The tips of the probe needles are desirably less in diameter than the bonding pad area. However, through repeated contact with bonding pads, the probe needles can become displaced. Depending on the density by which the bonding pads are arranged around the periphery of an integrated circuit, a probe needle could miss the bonding pad or contact possibly two closely spaced bonding pads, and thereby show a failure in the test operation when, instead, the integrated circuit may be electrically acceptable.

While it is desirable to make probe needles as thin as possible to accommodate closely spaced bonding pads, there is a limit to the thinness of the probe needles. Not only will thinner probe needles show a greater propensity to becoming displaced, but the tips of the thinner probe needles will have a significantly shorter lifespan.

It would be desirable to provide a mechanism for probing bonding pads of an integrated circuit during the wafer sort electrical test, yet would not require the use of thinner needles to probe densely spaced bonding pads. It would be further desirable to effectively spread out the distribution of the bonding pads to increase the perceived bonding pad pitch. This would allow a thicker set of probe needles to be used spaced relatively far from one another even though the bonding pad pitch remains fairly close. The desired improvements would, therefore, achieve a virtual bonding pad displaced from the normal set of bonding pads to allow probing of that pad, yet prevents probing the densely-spaced bonding pad that will eventually receive a wire bond. By not having to probe a densely spaced bonding pad, instances of gouging the bonding pad which will eventually receive a wire bond is eliminated.

SUMMARY OF THE INVENTION

The problems outlined above may be in large part solved by an integrated circuit topography that includes at least two rows of bonding pads configured about each integrated circuit perimeter. The bonding pads are configured on the upper topography of the integrated circuit, and preferably receive a wire bond. Alternatively, the bonding pads can be surface-mounted in a flip-chip arrangement. In addition to the bonding pads, dedicated probe pads are available. The probe pads are connected to respective bonding pads. Instead of probing all of the bonding pads, a probe operator will advantageously connect probe needles to the probe pads attributed to some of the bonding pads. This leaves the bonding pads, to which the probe pads are connected, in a pristine condition. No gouging, scraping, or material dislocation occurs on various bonding pads that would deleteriously effect bonding to that pad.

According to one embodiment, every other bonding pad within a first row of bonding pads is connected to every other probe pad within a third row of probe pads. Moreover, every other bonding pad within a second row of bonding pads is connected to every other probe pad within a fourth row of probe pads. The third row of probe pads extends a spaced distance from the first and second rows of bonding pads, and it is parallel to the two rows of bonding pads. The same can be said for the fourth row of probe pads that extends along an axis spaced from the rows of bonding pads, yet parallel to the axis along which the rows of bonding pads are spaced.

The third row of probe pads are preferably located within a scribe area of the integrated circuit. Thus, the third row of probe pads are sacrificial pads which, after probing is completed, are scribed in order to separate neighboring integrated circuits during the wafer "dicing" operation. The fourth row of probe pads are preferably closer to the interior of the integrated circuit than the two rows of bonding pads. The integrated circuit can be laid out so that metal conductors do not extend in the path of the fourth row of probe pads and in the path of any trace conductors which extend between the fourth row of probe pads and every other bonding pad within a row of bonding pads. If necessary, the trace conductors can be arranged on a layer beneath the topography on which the probe pads and bonding pads are configured. This will allow conductors to extend above the trace conductors, yet allowing them to be electrically isolated from the trace conductors. Placing the trace conductors on lower level portions of the integrated circuit is accomplished by patterning the trace conductors on, for example, the first layer of metal and placing vias between the first layer of metal and, for example, a second layer of metal on which the bonding pads and probe pads exist.

Advantageously, only the bonding pads are receptors for bonding to a package, substrate, or printed circuit board in a wire bond or flip-chip arrangement. The probe pads are purposely designed not as receptors for bonding to a wire, substrate, or printed circuit board. Instead, the probe pads can only receive probe needles.

By connecting every other bonding pad within one row to probe pads, and connecting every other bonding pad within another row of bonding pads to corresponding rows of probe pads, an effective fan-out configuration can be achieved. This will then redistribute the perceived pitch of the bonding pads during a probe operation. Instead of having to probe each and every bonding pad, the probe needles can be configured to only probe every other one of the bonding pads, and each of the probe pads which, advantageously, are spread out from the densely patterned bonding pads.

Although two rows of bonding pads are envisioned in the most simple form, more than two rows can be achieved. In fact, if a third row of bonding pads exists, then a corresponding additional row of probe pads will be needed. The additional row of probe pads, or sixth row of probe pads, will connect to every other bonding pad within a fifth row of bonding pads. The fifth row of bonding pads preferably has the same pitch between bonding pads as the first and second rows of bonding pads, and extends in a row parallel to the first and second rows of bonding pads.

BRIEF DESCRIPTION OF THE DRAWINGS

Other objects and advantages of the invention will become apparent upon reading the following detailed description and upon reference to the accompanying drawings in which.

Figure 1:
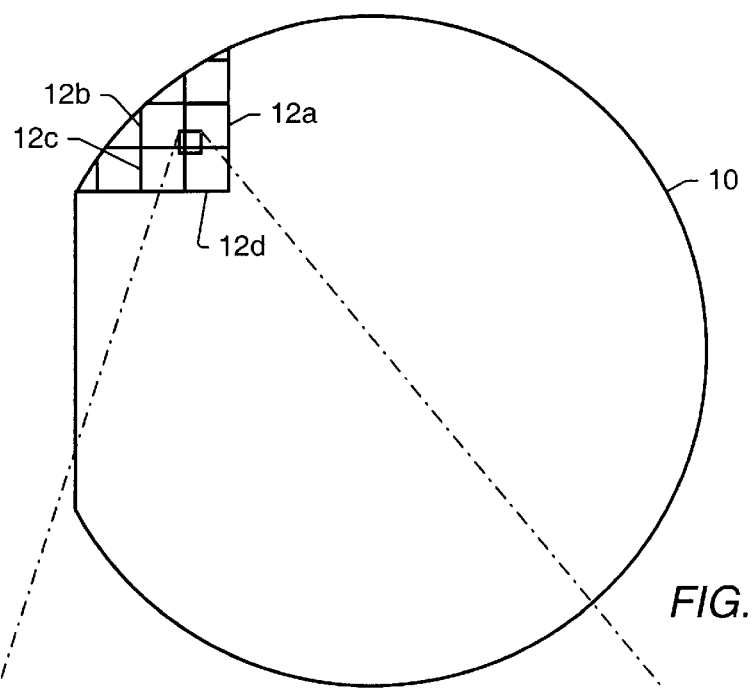
FIG. 1 is a top plan view an array of integrated circuits formed across a wafer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, FIG. 1 illustrates a top plan view of wafer 10. Wafer 10 includes any semiconductor material on which multiple layers of features are formed. Those features include various implant regions and multiple layers of thin-films which culminate in a topography on which bonding pads can be configured near the edges of each integrated circuit 12. For sake of consistency in the nomenclature, rows of bonding pads are those which extend along a horizontal axis of the periphery of the integrated circuit. If the integrated circuit is rotated 90°, then the row of bonding pads remains even though the row would appear as a column but for the 90° rotation. A spaced set of bonding pads which extends along a line is hereinafter referred to as "a row of bonding pads."

Figure 2:
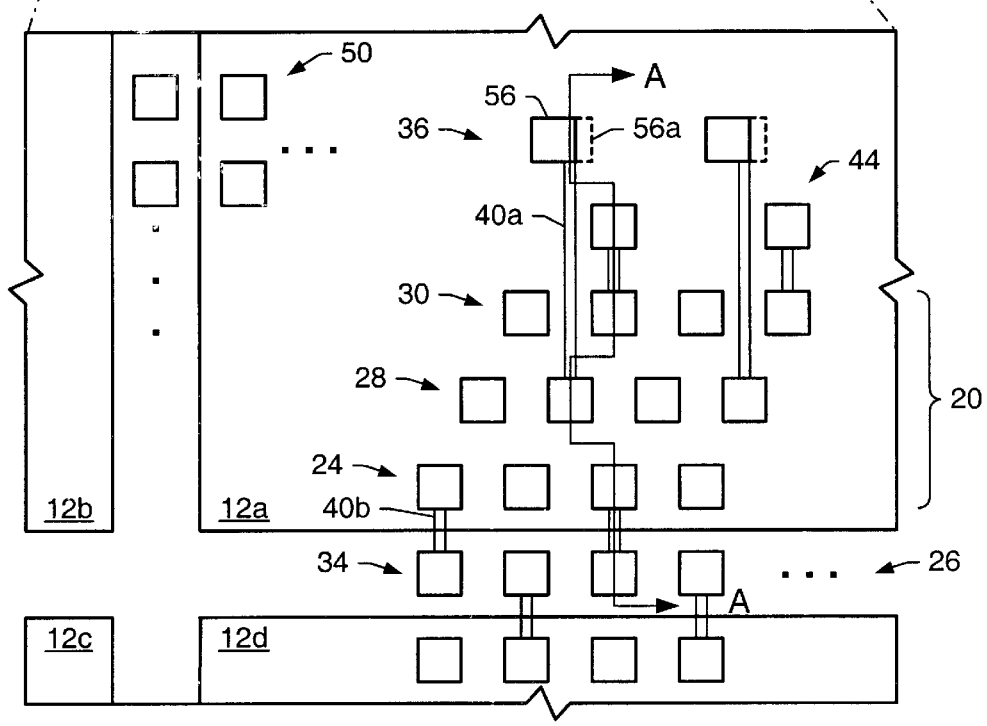
FIG. 2 is an exploded view of a portion of FIG. 1, illustrating a corner of an integrated circuit having at least two rows (or columns) of bonding pads and at least two rows (or columns) of probe pads coupled to select ones of the bonding pads.

FIG. 2 is an exploded, partial view of the bonding pad configuration near the periphery of an integrated circuit 12 of FIG. 1. In the example shown in FIG. 2, three primary rows of bonding pads 20 are applicable to integrated circuit 12a. A first row of bonding pads 24 are placed closest to the scribe area 26. A second row of bonding pads 28 are placed closer to the interior of integrated circuit 12a. A fifth row of bonding pads 30 may be placed even closer to the interior of integrated circuit 12a. The fifth row of bonding pads 30 may or may not be needed, depending on whether sufficient input/output pads can be arranged on two rows of bonding pads. If not, then a third row may be needed.

Connected to every other bonding pad within the first row of bonding pads 24 is a row of probe pads 34. Coupled to every other bonding pad within the second row of bonding pads 28 is another row of probe pads 36. Like probe pads 34, probe pads 36 connect to bonding pads within respective rows by trace conductors 40.

In order to maintain proper ordering of the various rows of bonding pads and probe pads, it is noted that every other bonding pad within the first row of bonding pads 24 is connected to every other probe pad within the third row of probe pads 34. Moreover, every other bonding pad within the second row of bonding pads 28 is connected to every probe pad within the fourth row of probe pads 36. If another row of bonding pads is needed (shown as numeral 30 in the fifth row), then every other probe pad within a sixth row of probe pads 44 is connected to every other bonding pad within the fifth row of bonding pads 30.

The pitch distances between bonding pads within the first, second, or fifth rows of bonding pads can be quite small. For example, the pitch distances can be less than 70 microns between center of one bonding pad and the center of the next spaced bonding pad within a row. The same might be said of the spacing between the axis along which the first row of bonding pads 24 extends and the axis along which the second row of bonding pads 28 extends. Distances between the center point axis of the first and second row of bonding pads can be, for example, less than 70 microns. Given a bonding pad dimension of 50 microns per side, the spacing between bonding pads could be, therefore, less than 20 microns. Most conventional probe needle tips are greater than 30 microns in diameter, leaving the possibility that the probe needle could become disoriented and contact two adjacent bonding pads if not for the fact that the present set of probe needles are spaced from each other to contact virtual bonding pads. The virtual bonding pads are the probe pads that are spaced from the rows of bonding pads as shown in FIG. 2.

Bonding pads within three rows of bonding pads 20 are connected to conductors which extend to various circuitry within integrated circuit 12a. Conversely, probe pads within rows 34, 36, and 44 do not connect to the integrated circuit conductors directly. Instead, the probe pads connect to such conductors via the trace conductor 40 and the corresponding bonding pads to which they connect. The probe pads can be of the same surface area as the bonding pads or, alternatively, can be made larger or smaller than bonding pads depending on the probe tip configuration. If the probe tip is made quite large, then the probe pads can also be made large in surface area. FIG. 2 illustrates a portion of four integrated circuits 12, with a scribe area 26 configured between neighboring integrated circuits. The scribe area does not contain functional circuitry, and purposely is sawed or scribed in that area to separate the integrated circuits after the probe operation. The third row of probe pads are configured exclusively within scribe area 26.

For sake of brevity, all bonding pads and probe pads within integrated circuits 12 are not shown. Only a portion of integrated circuit 12a is shown, and only a portion of bonding pad rows and probe pad rows are shown. It is understood, however, that the rows of bonding pads and probe pads also extends vertically along the upward edge of each of the integrated circuits 12. Thus, the configuration of bonding pads and probe pads along the horizontal axis are repeated along the vertical axis, as shown by reference numeral 50. Thus, each edge of the integrated circuit 12 contains at least two rows of bonding pads that extend parallel to the nearest integrated circuit edge. The bonding pads within each row are spaced equal distance from each other. A third row of probe pads extends outside the edge of the integrated circuit and within the scribe area, while a fourth row of probe pads extends internal to the integrated circuit. The nomenclature of increasing the number for each row is, therefore, applicable to both bonding pads and probe pads, so that the third row of probe pads is distinguishable from the second row of bonding pads, and so forth for each of the various rows of pads. It is also recognized that the rows of bonding pads and probe pads configured on one integrated circuit 12a, are repeated on each of the integrated circuits 12 throughout the wafer topography. Thus, any configuration of bonding pads and probe pads will appear consistent to probe needles arranged on a probe card and extending downward from a probe tester.

Figure 3:
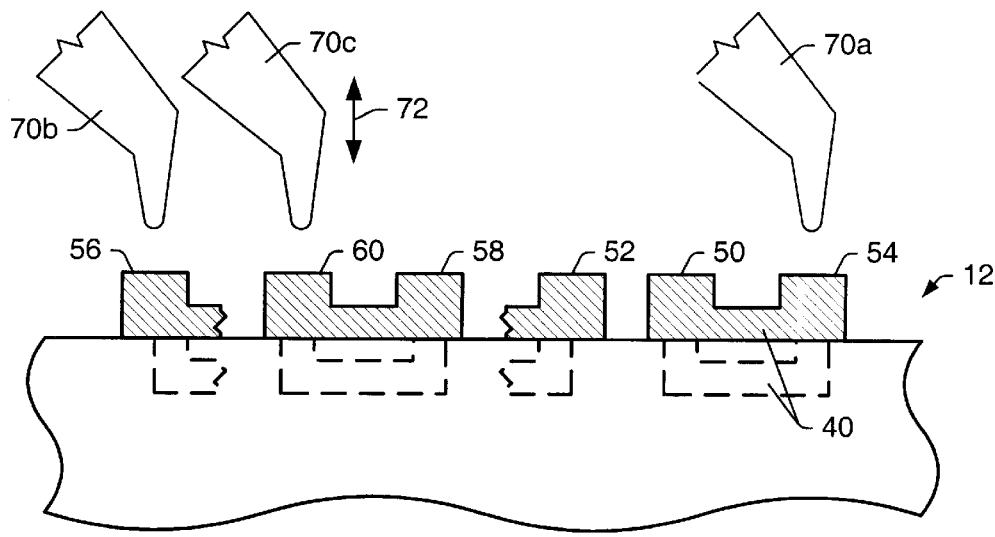
FIG. 3 is a cross-sectional view along plane A of FIG. 2 during probe testing of the integrated circuit.

Referring to FIG. 3, a cross-sectional view of the integrated circuit topography 12 is shown undergoing a probe operation. In particular, the cross-sectional view is taken along plane A—A of FIG. 2, and includes six pads: a first pad 50 within the first row of bonding pads 24 (shown in FIG. 2), a second pad 52 within the second row of bonding pads 28 (shown in FIG. 2), a third pad 54 within the third row of probe pads 34 (shown in FIG. 2), a fourth pad 56 within the fourth row of probe pads 36 (shown in FIG. 2), a fifth pad 58 within the fifth row of bonding pads 30 (shown in FIG. 2), and a sixth pad 60 within the sixth row of probe pads 44 (shown in FIG. 2). Pads 50, 52, and 58 have trace conductors extending on the upper surface of the integrated circuit topography, or are dielectrically spaced beneath the upper surface topography to corresponding probe pads 54, 56, and 60. Thus, every other one of the bonding pads within the first row of bonding pads is connected to every other one of the probe pads within the third row of probe pads. Similarly, every other one within the second row of bonding pads is connected to every other probe pad within the fourth row. Trace conductors 40 effectuate the connection between corresponding bonding pads and probe pads, and are either on the surface, or are below the surface, of the integrated circuit topography. Trace conductor 40 beneath the surface is shown in phantom to illustrate the alternative arrangement by which the trace conductor is configured. Preferably, the trace conductor is of minimum critical dimension (i.e., width), and can be of lesser thickness than the bonding pad to which it is connected. Alternatively, the trace conductor can be of the same thickness as the bonding pad.

FIG. 3 illustrates probe needles 70 that can reciprocate in concert up and down in the direction of arrow 72. If placed downward in contact with the corresponding probe pads 54, 56, and 60, electrical connection is made between the probe needles 70 and the internal circuitry of integrated circuit 12. Electrical testing can, therefore, be performed on, for example, the core logic of the integrated circuit.

Figure 4:
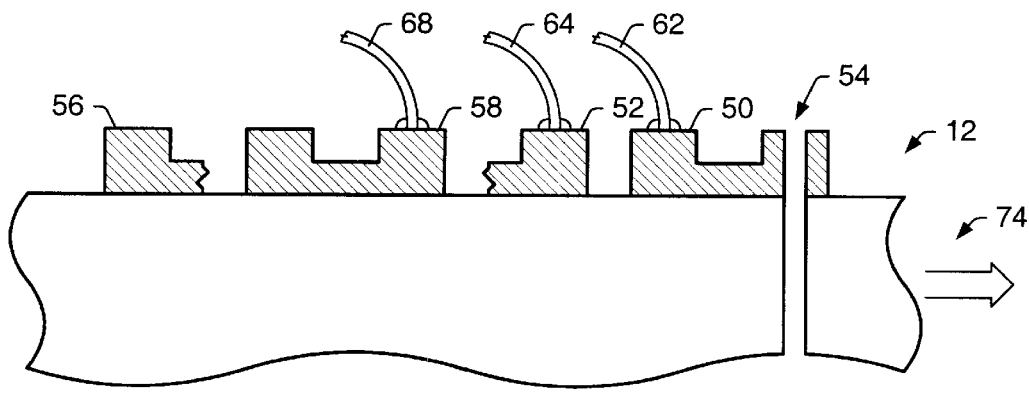
FIG. 4 is a cross-sectional view along plane A of FIG. 2 after wire bonding and separation of neighboring integrated circuits from the wafer.

FIG. 4 illustrates a subsequent operation by which bonding pads 50, 52, and 58 receive a wire bond 62, 64, and 68. Preferably, the wire bond is connected using any mechanical connection mechanism that allows electrical connectivity between the corresponding wire and bonding pad. Gold is only one form by which the connection can be made.

After the probe operation is completed and the integrated circuit passes functional testing applied through the probe needles 70 (of FIG. 3), the integrated circuit is scribed, and removed from neighboring integrated circuits of the wafer, as shown by reference numeral 74. Scribing involves sawing the wafer within the scribe area 26 (of FIG. 2). When scribing the wafer, probe pad 54 is cut in two and, in some instances, is entirely removed from the upper surface of integrated circuit 12. The scribe operation leaves probe pad 54 inoperable, and connectivity takes place through bonding pad 50 within the first row of bonding pads.

FIGS. 3 and 4 illustrate the contrast in uses between the probe pads 54, 56, and 60, and the bonding pads 50, 52, and 58. The probe pads can only receive probe needles 70, and the bonding pads, in the cross-section shown, can only receive bonds to the outside electrical subsystems. Thus, any bonding pad which is connected to a probe pad will never receive a probe needle. Of course, there are bonding pads which do receive probe needles. However, every other bonding pad within each of the rows of bonding pads are preferably connected to probe pads and, therefore, do not receive probe needles and the problems associated therewith.

Advantageously, every other bonding pad will not be gouged by probe needle contact, and will not suffer the possibility of a tightly configured set of probe needles being misaligned. Using probe pads in a fan-out arrangement allows thicker probe needles having a longer lifespan to be used. Moreover, the thicker probe needles can be arranged in a less dense fashion to prevent possible misalignment to neighboring pads.

Although two rows of bonding pads can be "fanned-out" to neighboring rows of probe pads, if three rows of bonding pads are employed, then three rows of probe pads are needed. Turning to FIG. 2, the fourth row of probe pads 36 must be configured closer towards the inner portion of integrated circuit 12a than the sixth row of probe pads 44. In order to maximize the distance between the fourth and sixth rows of probe pads 36 and 44, respectively, the fourth row of probe pads are shifted laterally away from the corresponding sixth row of probe pads 44, as shown by the difference between the probe pad in its non-shifted position 56a and the probe pad in the shifted position 56. By moving probe pad 56 away from the closest probe pad within the sixth row of probe pads 44, more distance is provided between probe pads to allow thicker probe needles of greater fan-out distances between probe needles to be used. As shown, probe pad 56 must be placed off-center from its connection to trace conductor 40a.

The process of connecting every other bonding pad within one or more rows of bonding pads to corresponding probe pads can be repeated for two or more rows of bonding pads around all four sides of an integrated circuit. It is important that only every other bonding pad be connected, and that only every other probe pad within the scribe area be connected to allow the remaining probe pads to be connected to corresponding bonding pads within the neighboring integrated circuit. However, the probe pads which extend more towards the interior of the integrated circuit must all be used to prevent an inappropriate, high density probe pad configuration in the interior portion that would exclude metal conductors normally attributed to the integrated circuit from existing in that area.

It will be appreciated to those skilled in the art having the benefit of this disclosure that this invention is believed to provide an integrated circuit topography that includes at least two rows of bonding pads and at least two rows of probe pads. Every other bonding pad within each row is connected to corresponding probe pads. The probe pads are used only to probe the integrated circuit and cannot receive a wire bond, or any other connection to an outside electrical subsystem. Each and every bonding pad which is connected by a trace conductor to a probe pad purposely does not receive a probe needle. It is intended that the following claims be interpreted to embrace all modifications and changes and, accordingly, the specification and drawings are to be regarded in an illustrative rather than a restrictive sense.

What is claimed is:

1. An integrated circuit topography, comprising a first row and a second row of bonding pads spaced from each other across the topography, wherein every other bonding pad within the first row is connected to every other probe pad within a third row, and wherein every other bonding pad within the second row is connected to every probe pad within a fourth row.

2. The integrated circuit topography as recited in claim 1, wherein the first, second, third and fourth rows extend along respective axes parallel to each other.

3. The integrated circuit topography as recited in claim 1, further comprising a scribe area outside an area of the integrated circuit topography containing electrically functional circuitry, and wherein the third row of probe pads are configured exclusively within the scribe area.

4. The integrated circuit topography as recited in claim 1, wherein the first and second rows of bonding pads, and the third and fourth rows of probe pads are configured on the same layer of the integrated circuit topography.

5. The integrated circuit topography as recited in claim 1, wherein the first and third rows of pads are connected by conductors that extend on the same layer or dissimilar layer of the topography as the first and third rows of pads yet perpendicular to the axes along with the first and third rows of pads extend.

6. The integrated circuit topography as recited in claim 1, wherein the second and fourth rows of pads are connected by conductors that extend on the same or dissimilar layer of the topography as the second and fourth rows of pads yet perpendicular to the axes along with the first and third rows of pads extend.

7. The integrated circuit topography as recited in claim 1, wherein each of the bonding pads within the first and second rows that is connected to corresponding probe pads within the third and fourth rows is excluded from receiving a probe needle.

8. The integrated circuit topography as recited in claim 1, wherein all probe pads within the third and fourth rows are configured to receive a probe needle.

9. The integrated circuit topography as recited in claim 1, wherein all probe pads within the third and fourth rows are excluded from receiving a wire bond.

10. The integrated circuit topography as recited in claim 1, wherein a shortest distance between bonding pads within the first row and corresponding probe pads within the third row is greater than the spacing between bonding pads within the first row.

11. The integrated circuit topography as recited in claim 1, wherein a shortest distance between bonding pads within the second row and corresponding probe pads within the fourth row is greater than the spacing between bonding pads within the second row.

* * * * *